US010770490B2

(12) United States Patent
Ando

(10) Patent No.: US 10,770,490 B2
(45) Date of Patent: Sep. 8, 2020

(54) SEMICONDUCTOR DEVICE AND ELECTRONIC APPARATUS

(71) Applicant: SONY CORPORATION, Tokyo (JP)

(72) Inventor: Yukihiro Ando, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/438,116

(22) Filed: Jun. 11, 2019

(65) Prior Publication Data
US 2019/0296061 A1 Sep. 26, 2019

Related U.S. Application Data

(63) Continuation of application No. 15/552,884, filed as application No. PCT/JP2016/054724 on Feb. 18, 2016, now Pat. No. 10,355,036.

(30) Foreign Application Priority Data

Mar. 3, 2015 (JP) ................. 2015-041240

(51) Int. Cl.
H01L 27/146 (2006.01)
H01L 23/00 (2006.01)
(Continued)

(52) U.S. Cl.
CPC .... *H01L 27/14601* (2013.01); *H01L 21/3205* (2013.01); *H01L 21/768* (2013.01); *H01L 23/32* (2013.01); *H01L 23/492* (2013.01); *H01L 23/522* (2013.01); *H01L 24/00* (2013.01); *H01L 24/09* (2013.01); *H01L 27/146* (2013.01); *H01L 27/14687* (2013.01); *H04N 5/369* (2013.01);
(Continued)

(58) Field of Classification Search
None
See application file for complete search history.

(56) References Cited

U.S. PATENT DOCUMENTS 9,691,733 B1 * 6/2017 Shen ................. H01L 24/83
2012/0068355 A1 * 3/2012 Aoki ................. H01L 25/0657
257/774

(Continued)

FOREIGN PATENT DOCUMENTS

JP 2002-280448 9/2002
JP 2009-055004 3/2009

(Continued)

Primary Examiner — Evren Seven
(74) Attorney, Agent, or Firm — Sheridan Ross P.C.

(57) ABSTRACT

The present disclosure relates to a semiconductor device and an electronic apparatus which is capable of reducing variations and deterioration of transistor characteristics. A first connection pad connected with a first wiring and a first floating metal greater than the first connection pad are formed at a bonding surface of a first substrate, whereas a second connection pad connected with a second wiring and a second floating metal greater than the second connection pad are formed at a bonding surface of a second substrate. The first floating metal and the second floating metal formed at the first substrate and the second substrate are bonded to each other. The present disclosure is applicable to a CMOS solid-state imaging device used for an imaging apparatus such as a camera, for example.

10 Claims, 11 Drawing Sheets

(51) Int. Cl.
*H01L 23/522* (2006.01)
*H04N 5/369* (2011.01)
*H01L 23/32* (2006.01)
*H01L 23/492* (2006.01)
*H01L 21/3205* (2006.01)
*H01L 21/768* (2006.01)

(52) U.S. Cl.
CPC ............. *H01L 24/05* (2013.01); *H01L 24/08* (2013.01); *H01L 24/80* (2013.01); *H01L 2224/05015* (2013.01); *H01L 2224/08123* (2013.01); *H01L 2224/08147* (2013.01); *H01L 2224/80895* (2013.01); *H01L 2224/80896* (2013.01); *H01L 2224/80986* (2013.01); *H01L 2924/00014* (2013.01); *H01L 2924/12043* (2013.01); *H01L 2924/1304* (2013.01); *H01L 2924/13091* (2013.01)

(56) References Cited

U.S. PATENT DOCUMENTS

| | | | | |
|---|---|---|---|---|
| 2012/0252189 | A1* | 10/2012 | Sadaka | H01L 24/05 438/455 |
| 2013/0009321 | A1* | 1/2013 | Kagawa | H01L 23/53266 257/774 |
| 2014/0273347 | A1* | 9/2014 | Tseng | H01L 21/76895 438/107 |
| 2016/0126136 | A1* | 5/2016 | Ashidate | H01L 27/1469 257/773 |

FOREIGN PATENT DOCUMENTS

| | | |
|---|---|---|
| JP | 2010-219339 | 9/2010 |
| JP | 2012-244101 | 12/2012 |
| JP | 2012-256736 | 12/2012 |
| JP | 2014-022561 | 2/2014 |

\* cited by examiner

FIG. 5
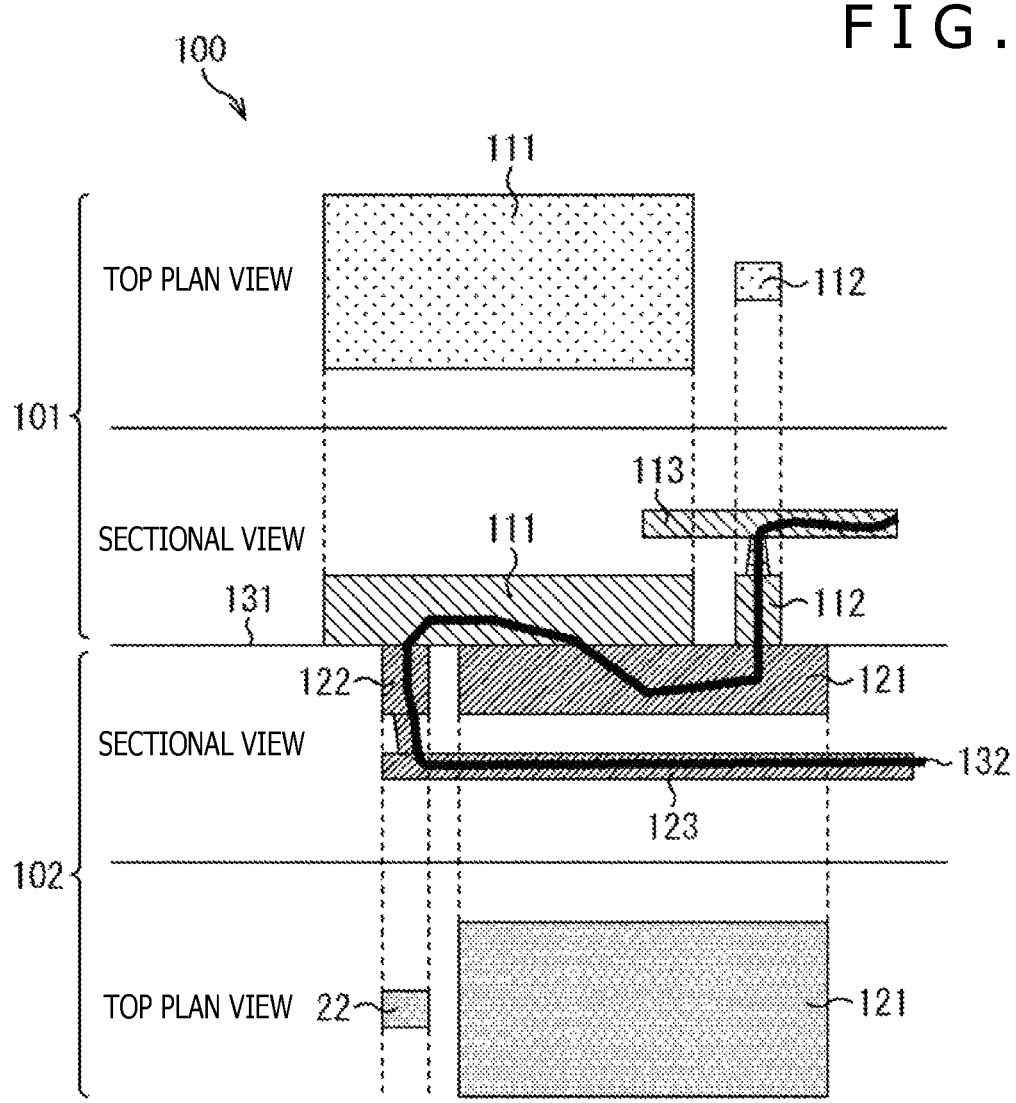
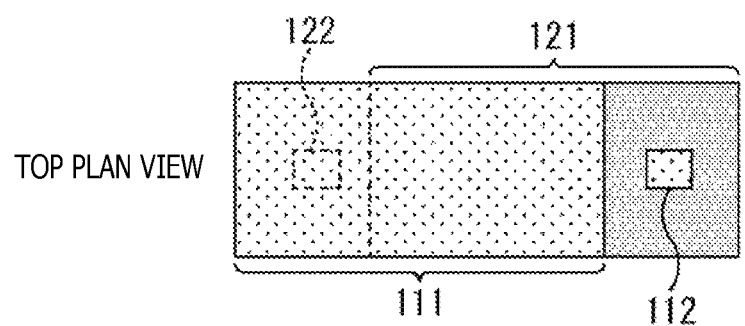

SEMICONDUCTOR DEVICE AND ELECTRONIC APPARATUS

CROSS REFERENCE TO RELATED APPLICATIONS

This application is a continuation of U.S. patent application Ser. No. 15/552,884, filed on Aug. 23, 2017, which is a national stage application under 35 U.S.C. 371 and claims the benefit of PCT Application No. PCT/JP2016/054724 having an international filing date of Feb. 18, 2016, which designated the United States, which PCT application claimed the benefit of Japanese Patent Application No. 2015-041240 filed Mar. 3, 2015, the disclosures of which are incorporated herein by reference in their entirety.

TECHNICAL FIELD

The present disclosure relates to a semiconductor device and an electronic apparatus, particularly to a semiconductor device and an electronic apparatus in which variations and deterioration of transistor characteristics can be reduced.

BACKGROUND ART

There has been proposed a technology in which two sheets of wafers (substrates) are bonded to each other to thereby connect wirings of the substrates to each other (see PTL 1).

In such a technology, in order to secure an overlay margin for bonding, it is preferable for metal portions exposed at bonding surfaces to be larger.

CITATION LIST

Patent Literature

[PTL 1]
JP 2000-299379 A

SUMMARY

Technical Problem

However, there has been a problem that when the large metal portions exposed at the bonding surfaces are formed by dry etching, if the metal portions are connected to transistors through underlying wirings, the risk of bringing about variations and deterioration of transistor characteristics would be raised.

The present disclosure has been made in consideration of such circumstances, and makes it possible to reduce the variations and deterioration of transistor characteristics.

Solution to Problem

In an aspect of the present technology, there is provided a semiconductor device including a floating metal formed at a bonding surface of a substrate. The floating metal is bonded to be utilized as a current path.

The floating metal is formed to be greater in area than a metal connected to an underlying wiring at a bonding surface of another substrate to be bonded to the bonding surface of the substrate.

There are provided a first floating metal at a bonding surface of a first substrate, a second floating metal at a bonding surface of a second substrate, a first metal connected to an underlying wiring at the bonding surface of the first substrate, and a second metal connected to an underlying wiring at the bonding surface of the second substrate. The first floating metal and the second metal are bonded to each other, the second floating metal and the first metal are bonded to each other, and the first floating metal and the second floating metal are bonded to each other.

The first floating metal is formed in such a manner as to have a vacant space in a first central area corresponding to a central portion of the first floating metal and to surround the first metal formed in the first central area, and the second floating metal is formed in such a manner as to have a vacant space in a second central area corresponding to a central portion of the second floating metal and to surround the second metal formed in the second central area.

The first floating metal and the first metal are formed in rectangular shapes at the bonding surface of the first substrate, and the second floating metal and the second metal are formed in rectangular shapes at the bonding surface of the second substrate.

The first floating metal is configured at the bonding surface of the first substrate in such a shape that, in either one of a transverse direction and a longitudinal direction of a rectangle with a vacant space in the first central area, a plurality of slits oriented in another direction are arranged, and the second floating metal is configured at the bonding surface of the second substrate in such a shape that, in the other direction of a rectangle with a vacant space in the second central area, a plurality of slits oriented in the one direction are arranged.

The first floating metal is configured at the bonding surface of the first substrate in such a shape that a plurality of blocks are each overlapping with at least one adjacent block at corners thereof while having a vacant space in the first central area, and the second floating metal is configured at the bonding surface of the second substrate in such a shape that a plurality of blocks are each overlapping with at least one adjacent block at corners thereof while having a vacant space in the second central area.

There are provided a floating metal at a bonding surface of a first substrate, and at least two metals connected to an underlying wiring at a bonding surface of a second substrate. The floating metal and the at least two metals are bonded together.

The semiconductor device is a solid-state imaging device.

In an aspect of the present technology, there is provided an electronic apparatus including a solid-state imaging device which includes a floating metal formed at a bonding surface of a substrate and in which the floating metal is bonded to be utilized as a current path, a signal processing circuit which processes an output signal outputted from the solid-state imaging device, and an optical system which lets incident light be incident on the solid-state imaging device.

In an aspect of the present technology, floating metals formed at bonding surfaces of substrates are bonded to each other to be utilized as a current path.

Advantageous Effect of Invention

According to the present technology, it is possible to reduce variations and deterioration of transistor characteristics.

Note that the effect described in the present specification is merely an example, the effect of the present technology is

BRIEF DESCRIPTION OF DRAWINGS

FIG. 5 depicts figures illustrating two substrates after bonding thereof.

DESCRIPTION OF EMBODIMENTS

Modes for carrying out the present disclosure (hereinafter referred to as embodiments) will be described below.

<General Configuration Example of Solid-State Imaging Device>

Figure 1:
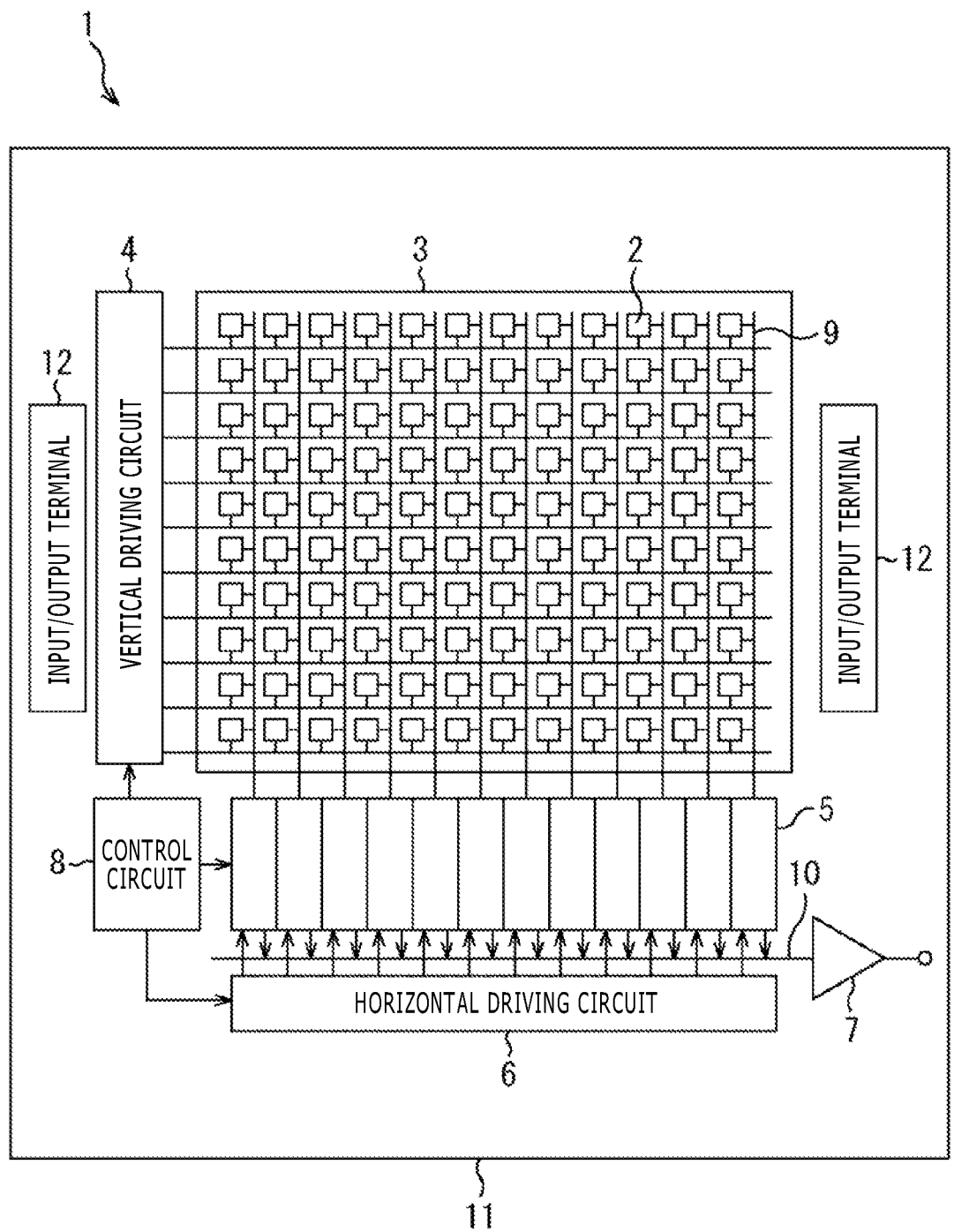
FIG. 1 is a block diagram depicting a general configuration example of a solid-state imaging device to which the present technology is applied.

FIG. 1 depicts a general configuration example as an example of a complementary metal oxide semiconductor (CMOS) solid-state imaging device applied to each embodiment of the present technology.

As depicted in FIG. 1, a solid-state imaging device (element chip) 1 includes a pixel region (so-called imaging region) 3 in which a plurality of pixels 2 including photoelectric conversion elements are regularly arranged in a two-dimensional pattern on a semiconductor substrate 11 (for example, a silicon substrate), and a peripheral circuit section.

The pixel 2 includes the photoelectric conversion elements (for example, photodiodes) and a plurality of pixel transistors (so-called MOS transistors). The plurality of pixel transistors may include, for example, three transistors, specifically, a transfer transistor, a reset transistor, and an amplification transistor, or may include four transistors by adding a selection transistor to the three transistors. An equivalent circuit for each pixel 2 (unit pixel) is similar to an ordinary one, and, hence, detailed description thereof is omitted here.

In addition, the pixels 2 may have a pixel sharing structure. The pixel sharing structure is configured from a plurality of photodiodes, a plurality of transfer transistors, one shared floating diffusion, and other one each shared pixel transistor. The photodiodes are photoelectric conversion elements.

The peripheral circuit section is configured from a vertical driving circuit 4, a column signal processing circuit 5, a horizontal driving circuit 6, an output circuit 7, and a control circuit 8.

The control circuit 8 receives an input clock and data for commanding an operation mode and the like, and outputs data such as internal information concerning the solid-state imaging device 1. Specifically, on the basis of a vertical synchronizing signal, a horizontal synchronizing signal, and a master clock, the control circuit 8 generates a clock signal and control signals which constitute a basis for operations of the vertical driving circuit 4, the column signal processing circuit 5, and the horizontal driving circuit 6. Then, the control circuit 8 inputs these signals to the vertical driving circuit 4, the column signal processing circuit 5, and the horizontal driving circuit 6.

The vertical driving circuit 4 includes, for example, a shift transistor, selects a pixel driving wiring, supplies the selected pixel driving wiring with pulses for driving the pixels 2, and drives the pixels 2 on a row basis. Specifically, the vertical driving circuit 4 selectively scans the pixels 2 in the pixel region 3 sequentially in a vertical direction on a row basis, and supplies the column signal processing circuit 5 with a pixel signal based on signal charges generated according to light reception amounts in the photoelectric conversion elements of the pixels 2, through vertical signal lines 9.

The column signal processing circuits 5 are arranged on the basis of, for example, each column of the pixels 2, and apply signal processing such as noise removal to signals outputted from the pixels 2 for one pixel row. Specifically, the column signal processing circuits 5 perform signal processing such as correlated double sampling (CDS) for removal of fixed pattern noises intrinsic of the pixels 2, signal amplification, and analog/digital (A/D) conversion. An output stage of the column signal processing circuit 5 is provided with a horizontal selection switch (not depicted) in connection with and between the output stage and a horizontal signal line 10.

The horizontal driving circuit 6 includes, for example, a shift register, and, by sequentially outputting horizontal scanning pulses, sequentially selects the respective column signal processing circuits 5, and causes pixel signals to be outputted from the respective column signal processing circuits 5 to the horizontal signal line 10.

The output circuit 7 applies signal processing to signals sequentially supplied from the respective column signal processing circuits 5 through the horizontal signal line 10, and outputs the processed signals. The output circuit 7 may perform only buffering, for example, or may perform black level adjustment, column variability correction, various kinds of digital signal processing, and the like.

An input/output terminal 12 is provided for transfer of signals to and from the exterior.

<Structure Example of Connection Section>

Figure 2:
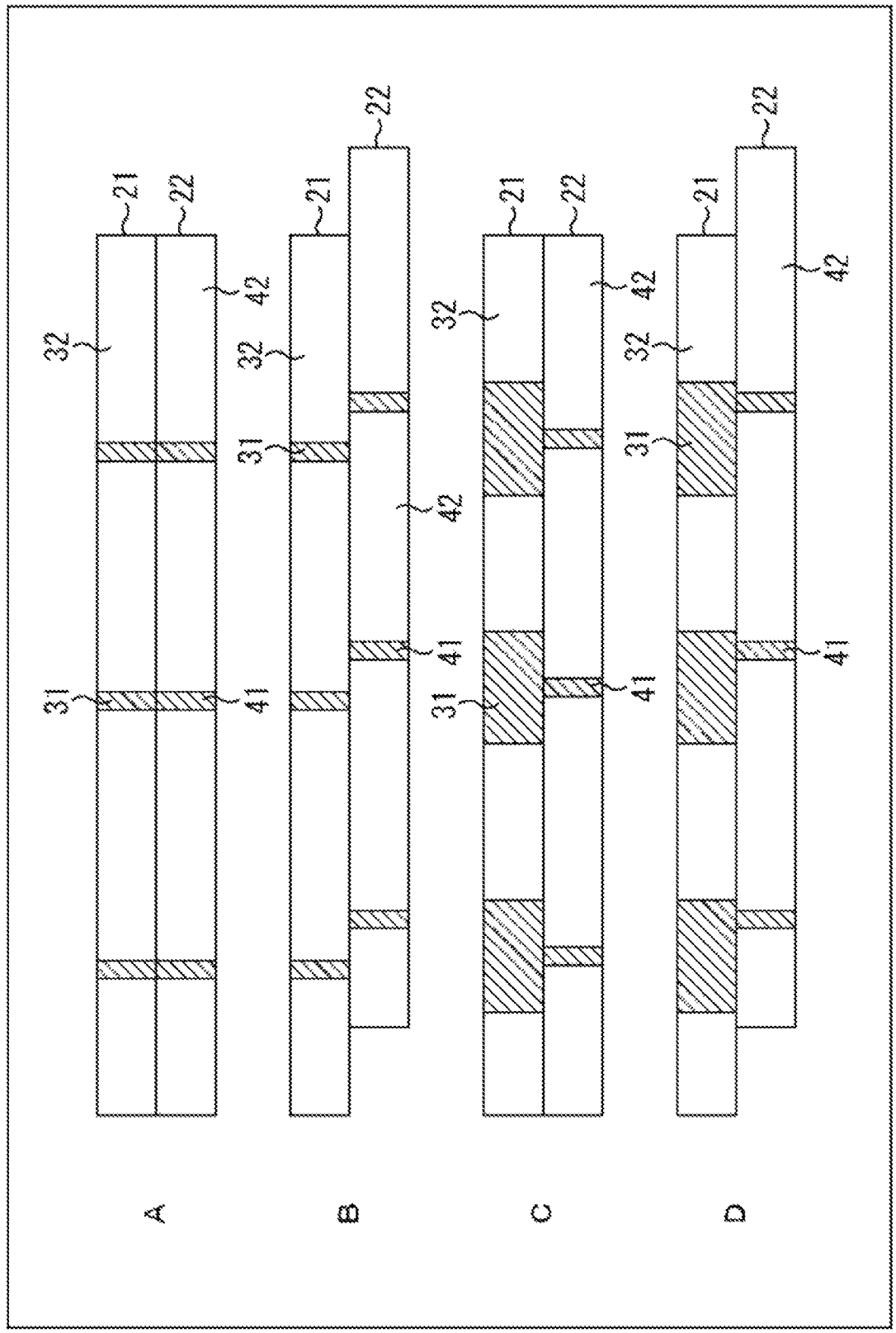
FIG. 2 depicts sectional views illustrating structures of a connection section when two substrates are bonded to each other.

FIG. 2 depicts sectional views illustrating structures of a connection section when two substrates (wafers) are bonded to each other. In a substrate 21, an insulating film 32 is formed with connection pads 31. In a substrate 22, an insulating film 42 is formed with connection pads 41. As depicted in A of FIG. 2, the connection pads 31 and the connection pads 41 are connected together to form current paths, whereby one intended circuit configuration is formed.

It is to be noted, however, that when misalignment is generated in bonding, the connection pads 31 and the connection pads 41 become open, as depicted in B of FIG. 2, so that an intended circuit operation is impossible and a lowering in yield is caused.

In view of this, when forming current paths by bonding two substrates, namely, a substrate 21 and a substrate 22 to each other, the connection pads 31 on at least one side should be formed in large areas for the purpose of providing a margin for the misalignment in bonding, as depicted in C of FIG. 2 and D of FIG. 2.

Figure 3:
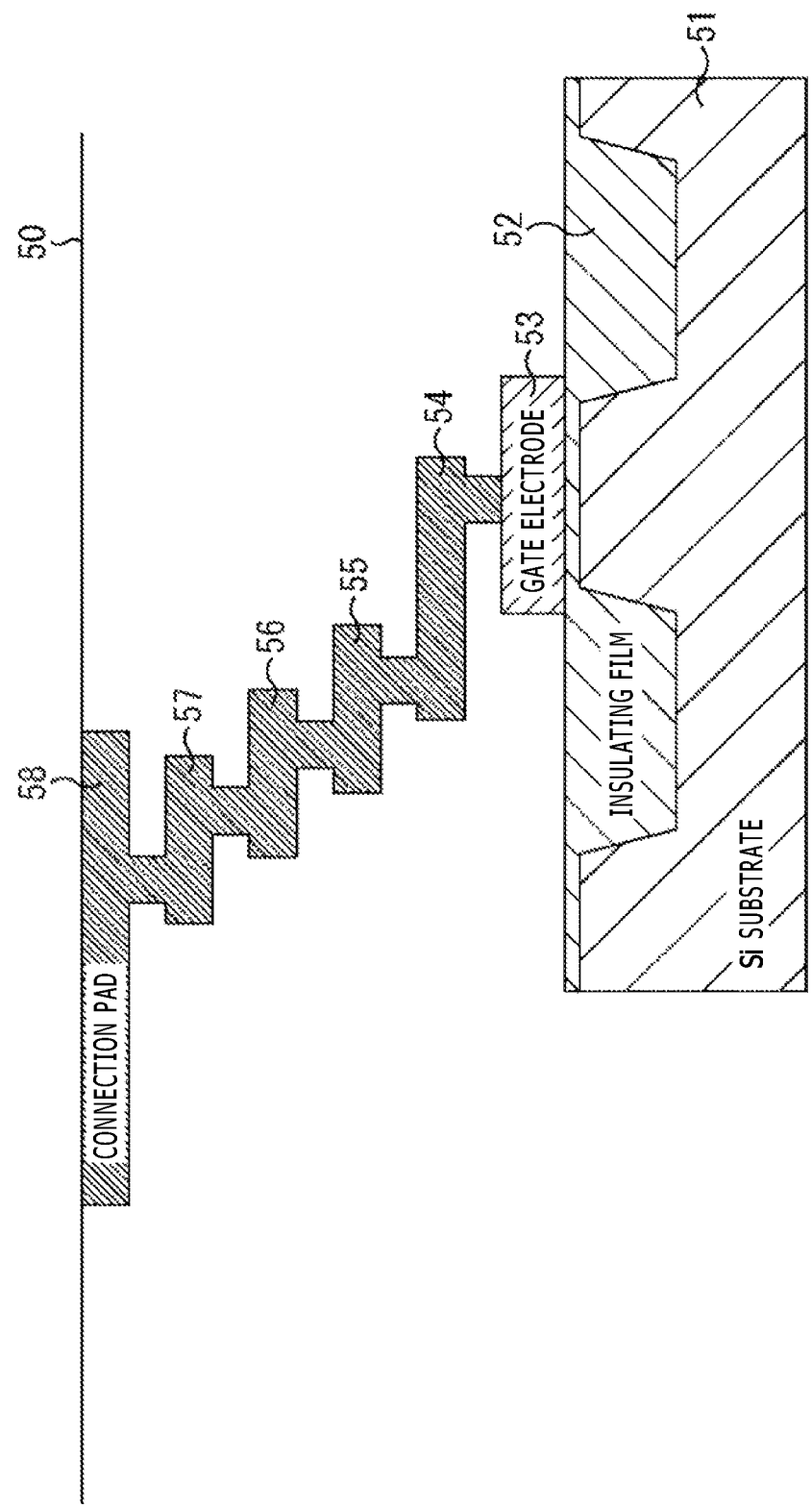
FIG. 3 is a sectional view of the structure of the substrate of FIG. 2.

When large-area connection pads 31 are formed as depicted in FIG. 3, however, an influence of plasma induced damage (PID) increases.

In an example of FIG. 3, a section of a structure of a substrate 50 is depicted. In the substrate 50, a Si substrate 51 is formed with an insulating film 52, and is provided with a gate electrode 53. From the gate electrode 53, wirings 54 to 57 are sequentially formed, and the large-area connection pad 58 connected to the wiring 57 is provided at a bonding surface of the substrate 50.

Plasma discharge is used for such a process as etching, sputtering, or chemical vapor deposition (CVD) in a step of forming the large-area connection pad 58, and electric charges built up due to the plasma discharge may induce, for example, deterioration of the gate insulating films of field effect transistors.

To avoid this problem, there has been proposed a method in which an antenna ratio ((area at upper surface of wiring)/(area of oxide film of gate)) is set to be low, as a design rule. If the area of the connection pad is set small, however, the margin for misalignment in bonding would be lost.

In view of this, in the present technology, at the time of forming connection pads, bonding surfaces of both substrates to be bonded to each other are formed with floating metals in large areas as compared to connection pads connected to an underlying wiring, and the bonding is conducted, whereby the floating metals are utilized as current paths.

<First Configuration Example of Present Technology>

Figure 4:
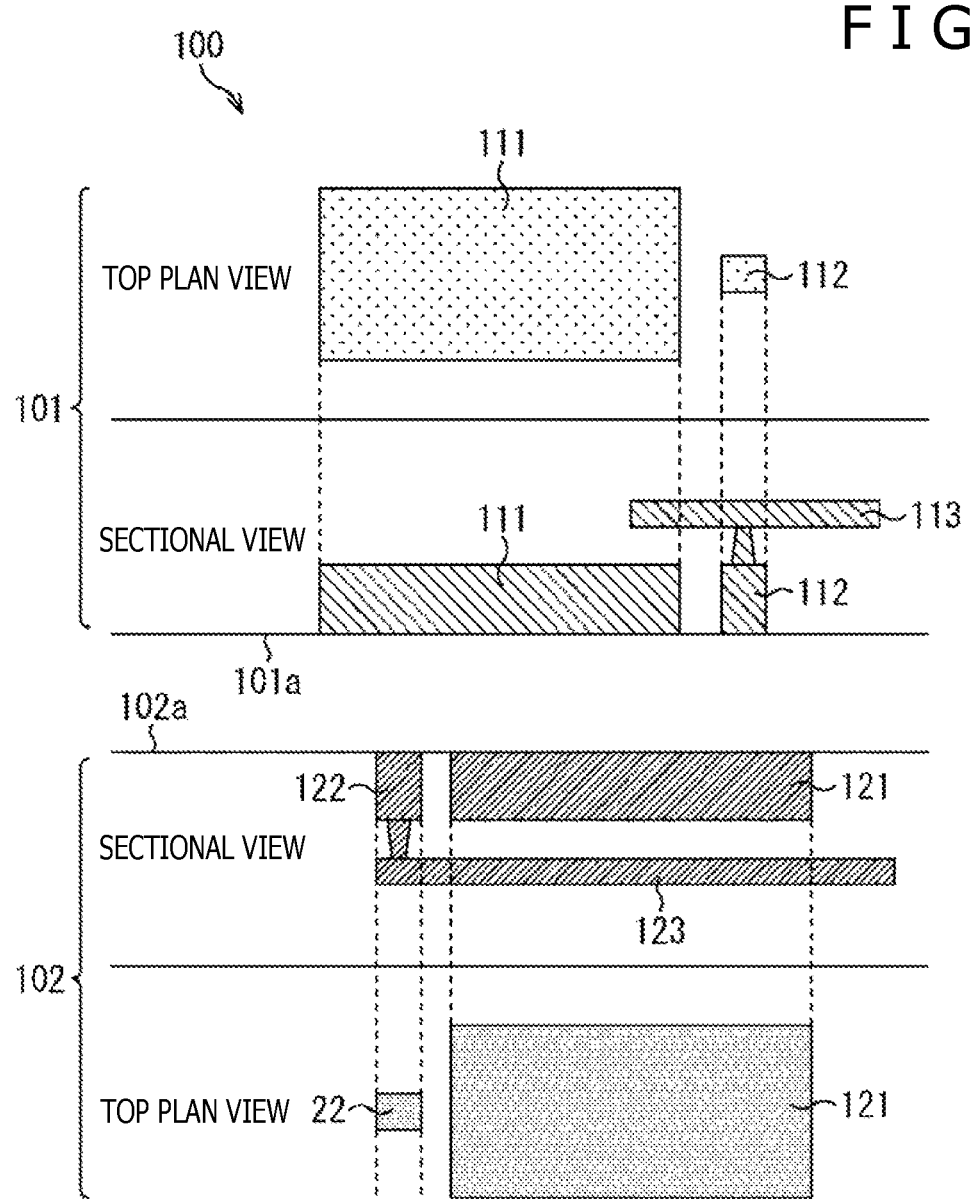
FIG. 4 depicts figures illustrating a structure of a solid-state imaging device to which the present technology is applied.

FIG. 4 depicts figures illustrating a structure of a solid-state imaging device to which the present technology is applied. The solid-state imaging device 100 is configured to include a substrate 101 and a substrate 102.

In an example of FIG. 4, the substrate 101 and the substrate 102 before bonding are depicted, with their bonding surfaces 101a and 102a located to face each other. Note that in FIG. 4, a top plan view on the substrate 101 side, a sectional view on the substrate 101 side, a sectional view on the substrate 102 side, and a top plan view on the substrate 102 are depicted in this order from the upper side.

As illustrated in FIG. 4, at the bonding surface 101a of the substrate 101, there are formed a connection pad 112 connected with a wiring 113, and a floating metal 111 large as compared to the connection pad 112. In addition, at the bonding surface 102a of the substrate 102, there are formed a connection pad 122 connected with a wiring 123, and a floating metal 121 great as compared to the connection pad 122. The floating metal 111 and the connection pad 112 are disposed separately so as not to contact each other, and the floating metal 121 and the connection pad 122 are disposed separately so as not to contact each other. Note that the connection pad 112, the floating metal 111, the connection pad 122, and the floating metal 121 are formed by the forming technique described in JP 2004-63859 A, for example.

Next, as depicted in FIG. 5, the substrate 101 and the substrate 102 are bonded to each other at the bonding surfaces 101a and 102a. The substrates 101 and 102 are bonded to each other by an arbitrary technique such as, for example, plasma joining and normal-temperature joining.

In an example of FIG. 5, the substrate 101 and the substrate 102 after bonding at the bonding surfaces 101a and 102a are depicted. Besides, in this figure, a top plan view on the substrate 101 side, a sectional view on the substrate 101 side, a sectional view on the substrate 102 side, and a top plan view of the substrate 102 are depicted in this order from the upper side, and further, a top plan view of the substrates 101 and 102 in a bonded state is depicted at the lowest position.

The bonding surfaces of the substrates 101 and 102 will hereinafter be referred to as a joint interface 131. As depicted in FIG. 5, the joint pad 112 and the floating metal 121 are connected together, the floating metal 121 and the floating metal 111 are connected together, the floating metal 111 and the joint pad 122 are connected together, and the floating metals 111 and 121 formed on the substrate 101 and the substrate 102, respectively, are bonded to each other, whereby the floating metals 111 and 112 are used as a current path 132.

By this, the area of the connection pad connected to the underlying wiring in connection with the field effect transistor can be reduced, and electric charges built up (charge-up) due to the plasma discharge used for such a process as etching, sputtering, or CVD in the step of forming the connection pads can reduce deterioration of the gate insulating film of the field effect transistors.

<Modification>

While an example in which the shape of the floating metals is a rectangle has been depicted in FIGS. 4 and 5 above, the present technology is not limited to the rectangular shape. For example, as depicted in FIG. 6, the floating metal 111 and the floating metal 121 may be formed in an annular shape, and the connection pad 112 and the connection pad 122 which are circular in shape may be individually formed in the areas of holes of the annular shapes.

Figure 6:
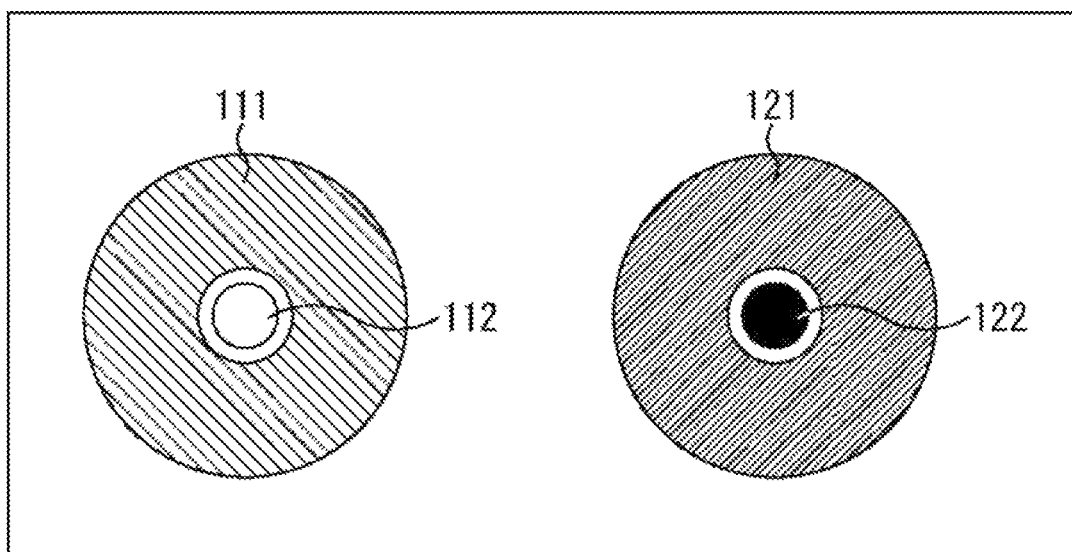
FIG. 6 illustrates another shape of a floating metal.

Note that while the inside and outside shapes of the annular shapes of the floating metal 111 and the floating metal 121 as well as the shapes of the connection pad 112 and the connection pad 122 are circular in the example of FIG. 6, the shapes are not limited to the circular shape.

Figure 7:
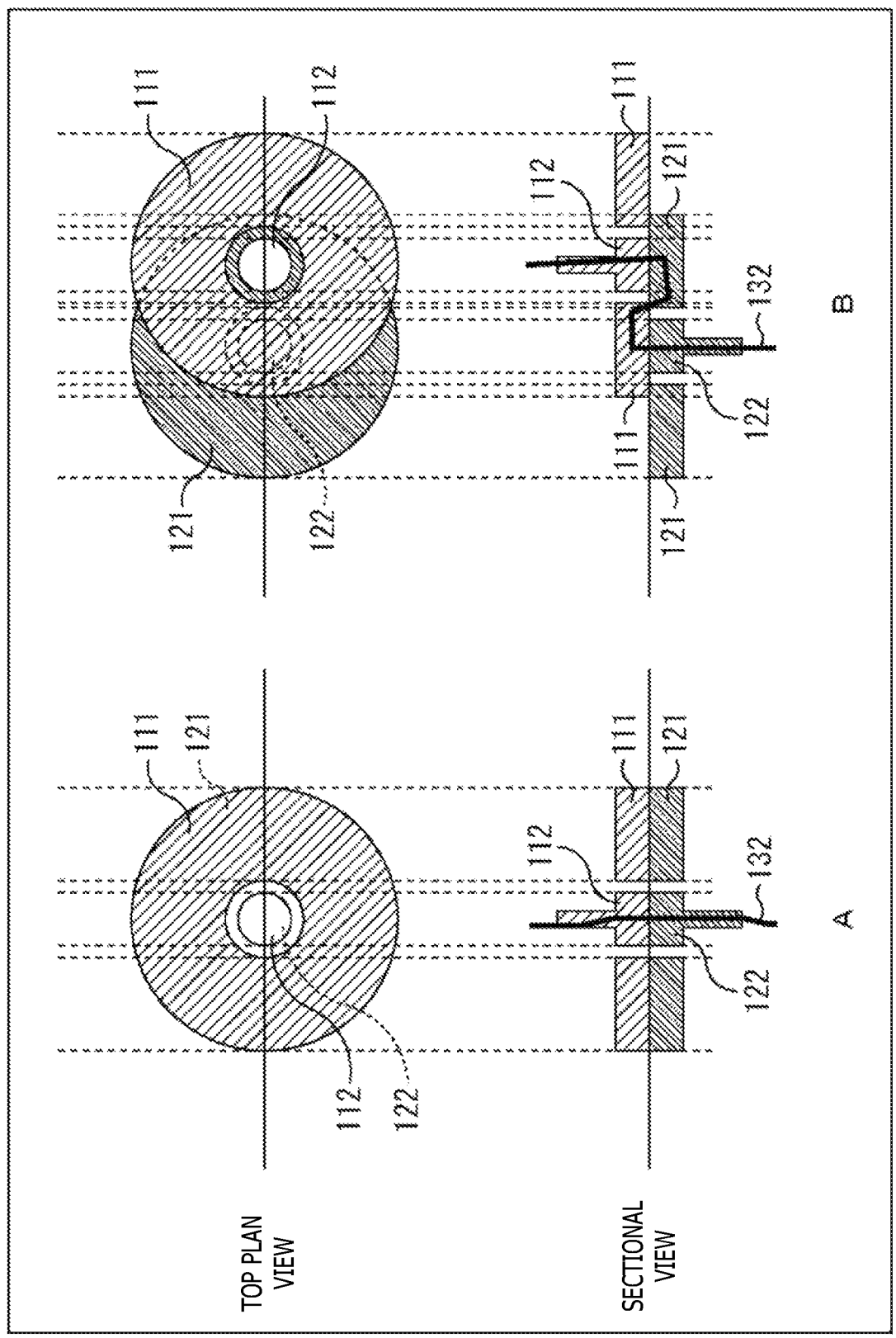
FIG. 7 depicts figures illustrating a current path after bonding.

FIG. 7 depicts figures illustrating a current path in the case where a substrate 101 and a substrate 102 provided with the floating metal 111 and the floating metal 121 in the example of FIG. 6 are bonded to each other. In the example of FIG. 7, top plan views and sectional views are depicted in this order from the upper side.

A of FIG. 7 is a figure illustrating the current path in the case where the positions of the substrates 101 and 102 are substantially in register when the substrates are bonded to each other. B of FIG. 7 is a figure illustrating the current path in the case where the positions of the substrates 101 and 102 are deviated from each other when the substrates are bonded to each other.

In the case where the positions of the substrates 101 and 102 are substantially in register as depicted in A of FIG. 7, the connection pad 112 of the substrate 101 and the connection pad 122 of the substrate 102 are utilized as a current path 132.

On the other hand, in the case where the positions of the substrates 101 and 102 are deviated from each other when the substrates are bonded to each other as depicted in B of FIG. 7, the connection pad 112 of the substrate 101, the floating metal 121 of the substrate 102, the floating metal 111 of the substrate 101, and the connection pad 122 of the substrate 102, in this order (or in the reverse order), are utilized as a current path 132.

Figure 8:
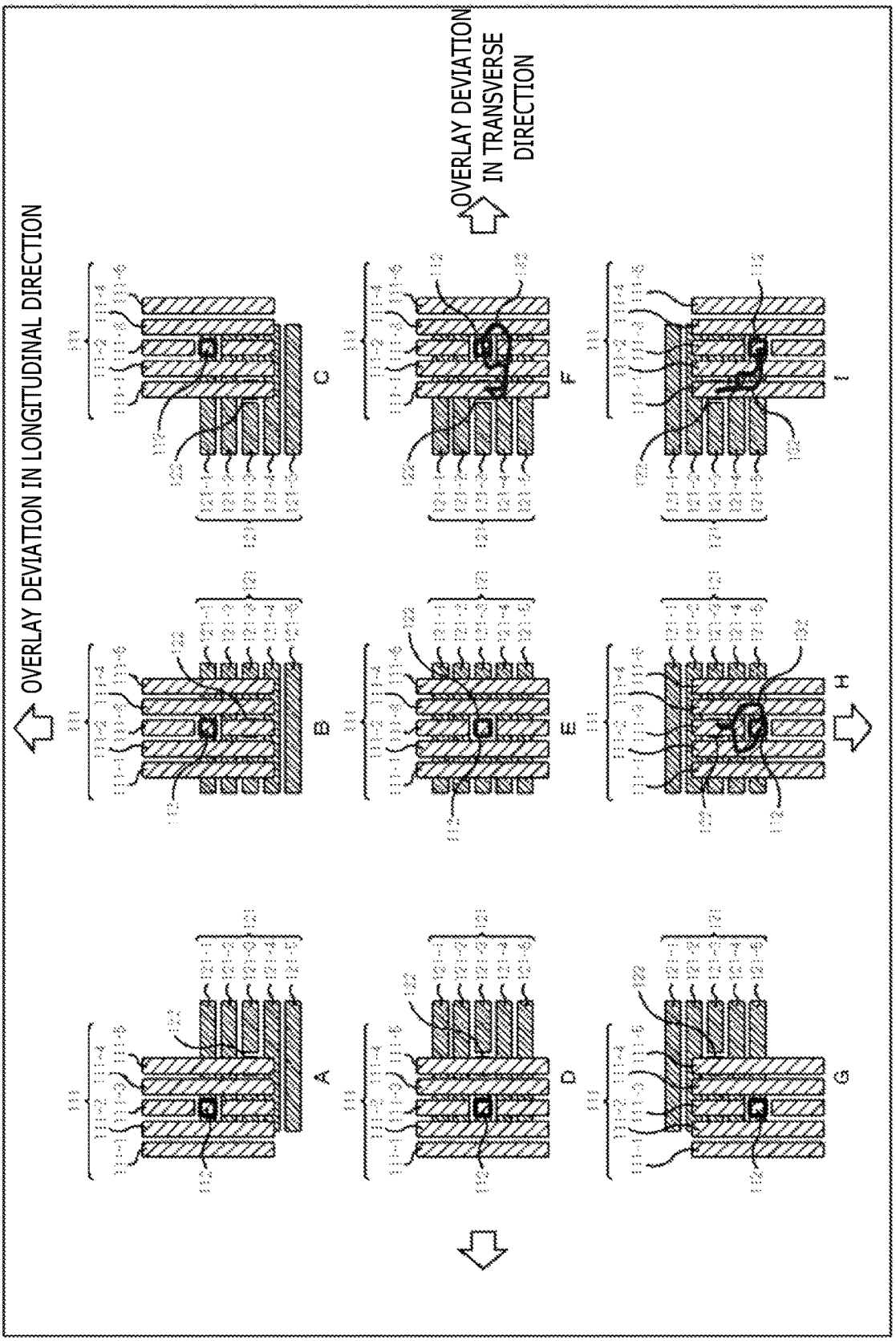
FIG. 8 depicts figures illustrating further shapes of the floating metals.

FIG. 8 depicts figures illustrating further shapes of floating metals. In the example of FIG. 8, the floating metal 111 of the substrate 101 is configured to have a vacant space in a central area and to have a plurality of (in the case of the example of FIG. 8, five) rectangles 111-1 to 111-5 elongated in a longitudinal direction being arranged in a transverse direction, with a connection pad 112 formed in the central area. In other words, the floating metal 111 is configured in such a shape that a plurality of slits oriented in the longitudinal direction are arranged in the transverse direction of a rectangle having a vacant space in a central area.

In addition, the floating metal 121 of the substrate 102 is configured to have a vacant space in a central area and to have a plurality of (in the case of the example of FIG. 8, five) rectangles 121-1 to 121-5 elongated in the transverse direction being arranged in the longitudinal direction, with a connection pad 122 formed in the central area. In other words, the floating metal 121 is configured in such a shape that a plurality of slits oriented in the transverse direction are arranged in the longitudinal direction of a rectangle having a vacant space in a central area.

A of FIG. 8 to D of FIG. 8 are figures depicting examples of misalignment in bonding (hereinafter referred to as overlay deviations) in which the substrate 101 is deviated from the substrate 102 individually to the left upper side, the upper side, the right upper side, and the left side when the substrate 101 and the substrate 102 are bonded to each other. E of FIG. 8 is a figure depicting an example in which the substrate 101 does not have any overlay deviation in relation to the substrate 102. F of FIG. 8 to I of FIG. 8 are figures depicting examples of overlay deviation in which the substrate 101 is deviated from the substrate 102 individually to the right side, the left lower side, the lower side, and the right lower side when the substrate 101 and the substrate 102 are bonded to each other.

Only in the case of E of FIG. 8, there is no overlay deviation, so that the connection pad 112 of the substrate 101 and the connection pad 122 of the substrate 102 are utilized as a current path 132.

In contrast, in the case of F of FIG. 8, parts ranging from the connection pad 112 of the substrate 101 through a rectangle 121-3 of the substrate 102, rectangles 111-2 and 111-4 of the substrate 101, a rectangle 121-4 of the substrate 102, and a rectangle 111-1 of the substrate 102 to the connection pad 122 are utilized as a current path 132.

In the case of H of FIG. 8, parts ranging from the connection pad 112 of the substrate 101 through a rectangle 121-5 of the substrate 102, rectangles 111-2 and 111-4 of the substrate 101, a rectangle 121-4 of the substrate 102, and a rectangle 111-3 of the substrate 101 to the connection pad 122 are utilized as a current path 132.

In the case of J of FIG. 8, parts ranging from the connection pad 112 of the substrate 101 through a rectangle 121-5 of the substrate 102, rectangles 111-1 and 111-2 of the substrate 101, a rectangle 121-4 of the substrate 102, and a rectangle 111-1 of the substrate 101 to the connection pad 122 are utilized as a current path 132.

Note that for convenience of explanation, the current path is not illustrated in other figures than these figures, but the floating metals are similarly utilized as a current path also in the cases of the other figures.

Figure 9:
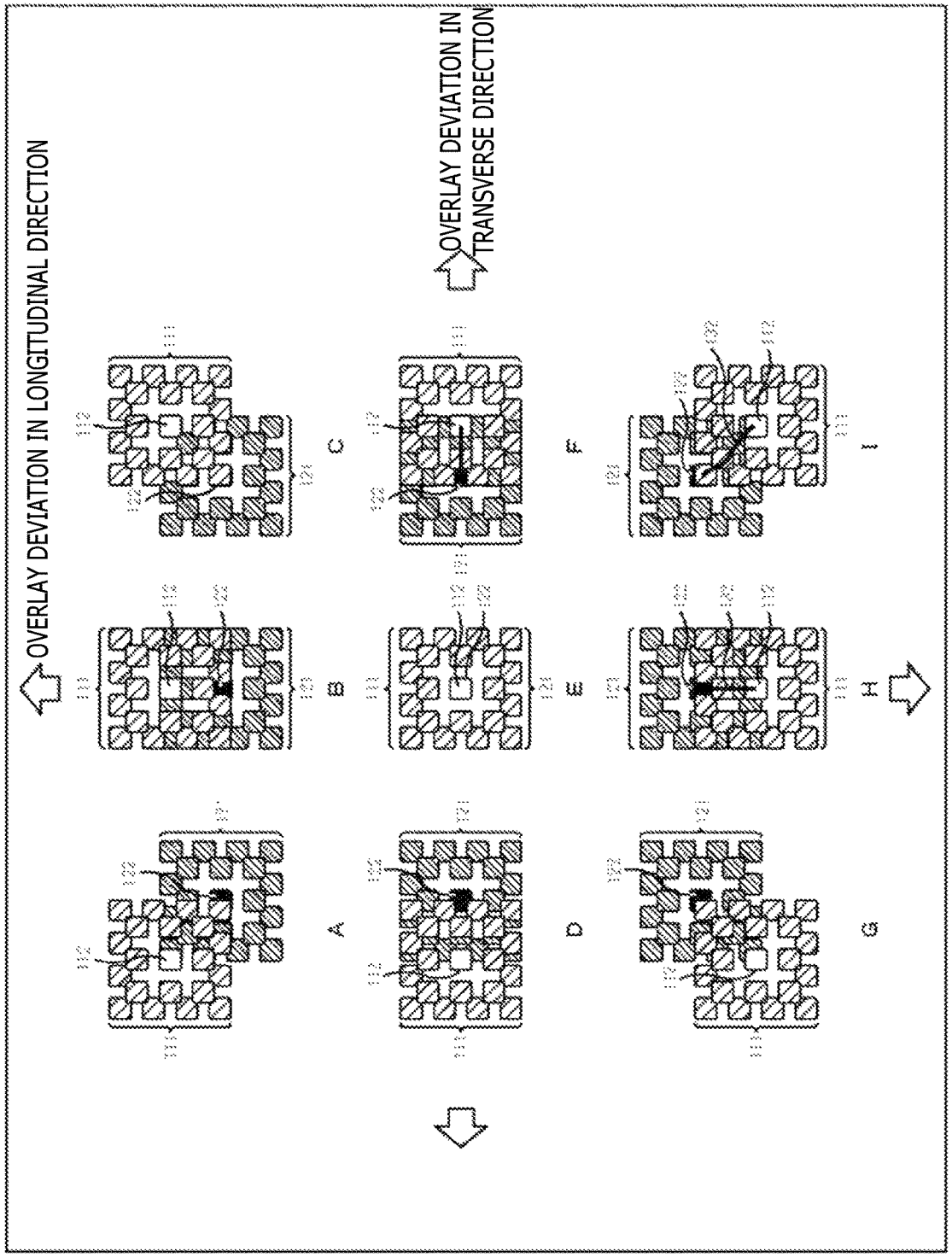
FIG. 9 depicts figures illustrating further shapes of the floating metals.

FIG. 9 depicts figures illustrating further shapes of floating metals. In the example of FIG. 9, the floating metal 111 of the substrate 101 and the floating metal 121 of the substrate 102 have a configuration in which in a rectangle having a vacant space in a central area, a plurality of (in the case of FIG. 9, twenty) blocks are arranged in the state of each being overlapping with at least one adjacent block at corners thereof.

A of FIG. 9 to D of FIG. 9 are figures depicting examples of overlay deviation in which the substrate 101 is deviated from the substrate 102 individually to the left upper side, the upper side, the right upper side, and the left side when the substrate 101 and the substrate 102 are bonded to each other. E of FIG. 9 is a figure depicting an example in which the substrate 101 does not have any overlay deviation in relation to the substrate 102. F of FIG. 9 to I of FIG. 9 are figures depicting examples of overlay deviation in which the substrate 101 is deviated from the substrate 102 individually to the right side, the left lower side, the lower side, and the right lower side when the substrate 101 and the substrate 102 are bonded to each other.

Only in the case of E of FIG. 9, there is no overlay deviation, so that the connection pad 112 and the connection pad 122 of the substrate 101 are utilized as a current path 132.

In contrast, in the cases of F of FIG. 9, H of FIG. 9, and I of FIG. 9, as depicted in the respective current paths 132, parts ranging from the connection pad 112 of the substrate 101 to the floating metal 121 and the connection pad 122 of the substrate 102 are utilized as a current path 132.

Note that for convenience of explanation, the current path is not illustrated in other figures than these figures, but the floating metals are similarly utilized as a current path also in the cases of the other figures.

In addition, while an example in which the connection pads and the floating metals are formed to constitute pairs in the substrate 101 and the substrate 102 has been described in the above description, this is not restrictive, and they may also be formed in the following manner.

<Second Configuration Example of Present Technology>

Figure 10:
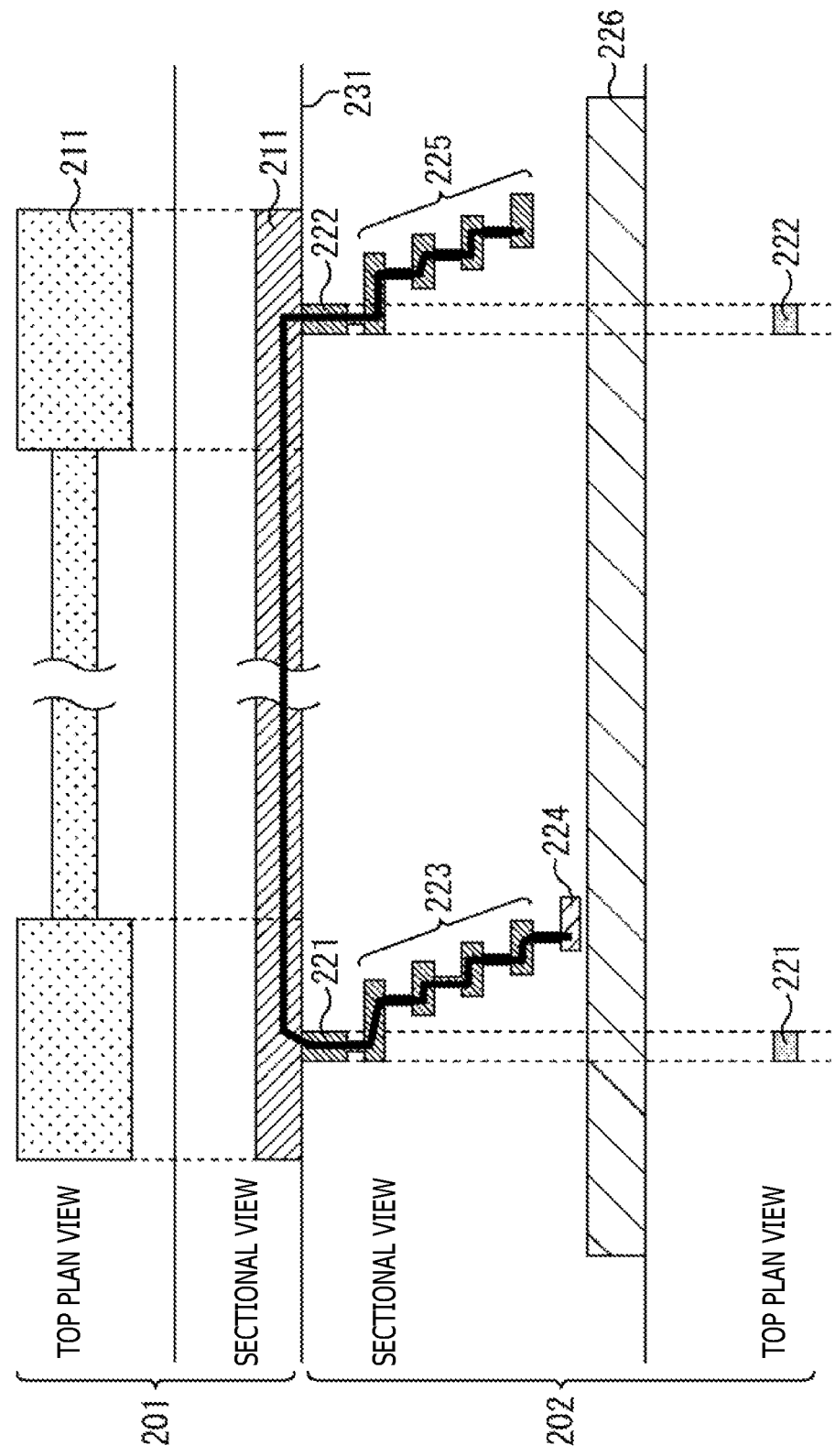
FIG. 10 depicts figures illustrating a structure of a solid-state imaging device to which the present technology is applied.

FIG. 10 depicts figures illustrating a structure of a solid-state imaging device to which the present technology is applied. A solid-state imaging device 200 is configured to include a substrate 201 and a substrate 202.

In the example of FIG. 10, there are illustrated the substrate 201 and the substrate 202 after bonding, specifically, after they are bonded to each other, with their bonding surfaces facing each other, at a joint interface 231. Note that in FIG. 10, a top plan view on the substrate 201 side, a sectional view on the substrate 201 side, a sectional view on the substrate 202 side, and a top plan view on the substrate 202 are depicted in this order from the upper side.

As depicted in FIG. 10, a floating metal 211 is formed at the bonding surface (namely, the joint interface 231) of the substrate 201.

On the joint surface 231 (namely, the joint interface 231) of the substrate 202, there are formed connection pads 221 and 222 which are connected respectively to underlying wirings 223 and 225. To the underlying wiring 223 is connected a gate electrode which is formed on a silicon substrate 226.

Therefore, with the substrates 201 and 202 bonded to each other at the joint interface 231, parts ranging from the gate electrode 224 of the substrate 202 through the underlying wiring 223, the connection pad 221, the floating metal 211 of the substrate 201, and the connection pad 222 of the substrate 201 to the underlying wiring 225 are utilized as a current path 232.

As above-mentioned, in the solid-state imaging device 200 of FIG. 10, also, the area of the connection pads connected to the underlying wirings in connection with field effect transistors can be reduced. Therefore, electric charges built up (charge-up) due to plasma discharge used for such a process of etching, sputtering, or CVD in a step of forming the connection pads can reduce deterioration of gate insulating films of the field effect transistors.

Besides, where the floating metal not connected to the underlying wiring is enlarged, margin for bonding can be secured.

Note that an example of stacking two layers of substrates has been described in the above description, the number of layers is not limited to two.

Note that a configuration in which the present technology is applied to a CMOS solid-state imaging device has been described above, the present technology may also be applied to such a solid-state imaging device as a charge coupled device (CCD) solid-state imaging device. Besides, the present technology is applicable not only to the solid-state imaging devices but also to semiconductor devices.

In addition, the application of the present technology is not limited to solid-state imaging devices and semiconductor devices, and the present technology is also applicable to imaging devices. The imaging devices here include camera systems, such as digital still cameras and digital video cameras, as well as electronic apparatuses that have an imaging function, such as mobile phones. Note that a form of a module mounted on an electronic apparatus, namely, a camera module, may be the imaging device.

<Configuration Example of Electronic Apparatus>

Here, referring to FIG. 11, a configuration example of an electronic apparatus to which the present technology is applied will be described.

Figure 11:
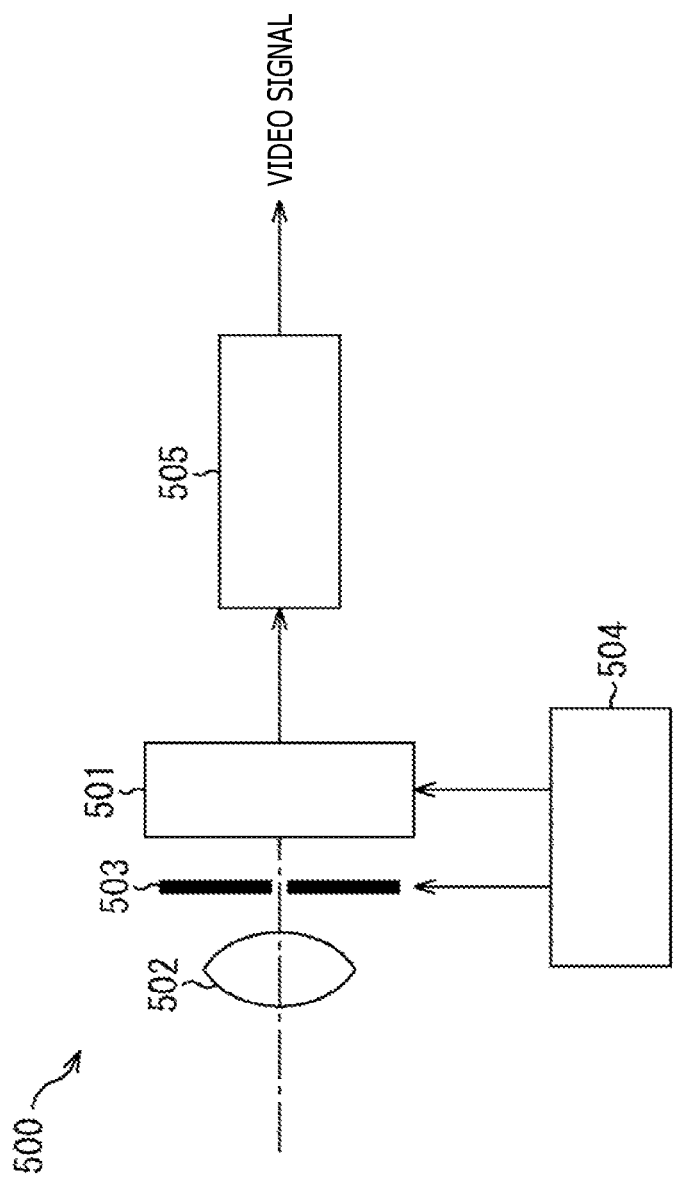
FIG. 11 is a block diagram depicting a configuration example of an electronic apparatus to which the present technology is applied.

An electronic apparatus 500 depicted in FIG. 11 includes a solid-state imaging device (element chip) 501, an optical lens 502, a shutter device 503, a driving circuit 504, and a signal processing circuit 505. As the solid-state imaging device 501, the solid-state imaging device according to the present technology described above is provided. By this, it is possible to provide an electronic apparatus 500 in which variations and deterioration of transistor characteristics are reduced and which has good performance.

The optical lens 502 focuses image light (incident light) coming from a subject to form an image on an imaging surface of the solid-state imaging device 501. By this, signal charges are accumulated in the solid-state imaging device 501 for a predetermined period of time. The shutter device 503 controls light irradiation period and light blocking period concerning the solid-state imaging device 501.

The driving circuit 504 supplies driving signals for controlling a signal transfer operation of the solid-state imaging device 501 and a shutter operation of the shutter device 503. According to the driving signal (timing signal) supplied from the driving circuit 504, the solid-state imaging device 501 performs signal transfer. The signal processing circuit 505 performs various kinds of signal processing to a signal outputted from the solid-state imaging device 501. A video signal obtained upon the signal processing is stored in a storage medium such as a memory and/or is outputted to a monitor.

Note that herein the steps describing a series of processing as above include not only processing carried out on a time series basis in the described sequence but also processing carried out concurrently or individually, without being necessarily carried out on a time series basis.

In addition, the embodiments of the present disclosure are not limited to the aforementioned embodiments, and various modifications are possible without departing from the scope of the gist of the present disclosure.

Besides, the configuration described above as one device (or processing section) may be configured as a plurality of devices (or processing sections). Conversely, the configuration described above as a plurality of devices (or processing sections) may be configured as one device (or processing section). In addition, other configuration than the aforementioned ones may be added to the configuration of each device (or each processing section). Further, part of the configuration of a device (or processing section) may be included in the configuration of other device (or other processing section), if the configuration or operation of a system as a whole is substantially the same. In other words, the present technology is not limited to the aforementioned embodiments, and various modifications are possible without departing from the scope of the gist of the present technology.

While the preferred embodiments of the present disclosure have been described in detail above referring to the accompanying drawings, the disclosure is not limited to the described examples. It is clear that one with common knowledge in the art to which the present disclosure pertains can arrive at various modifications and corrections within the category of the technical thought described in the claims, and it is understood that such modifications and corrections naturally belong to the technical scope of the present disclosure.

Note that the present technology may assume the following configurations.

(1) A semiconductor device including:
a floating metal formed at a bonding surface of a substrate,
wherein the floating metal is bonded to be used as a current path.

(2) The semiconductor device as described in (1) above,
wherein the floating metal is formed to be greater in area than a metal connected to an underlying wiring at a bonding surface of another substrate to be bonded to the bonding surface of the substrate.

(3) The semiconductor device as described in (1) or (2) above, further including:
a first floating metal at a bonding surface of a first substrate;
a second floating metal at a bonding surface of a second substrate;
a first metal connected to an underlying wiring at the bonding surface of the first substrate; and
a second metal connected to an underlying wiring at the bonding surface of the second substrate,
wherein the first floating metal and the second metal are bonded to each other,
the second floating metal and the first metal are bonded to each other, and
the first floating metal and the second floating metal are bonded to each other.

(4) The semiconductor device as described in (3) above,
wherein the first floating metal is formed in such a manner as to have a vacant space in a first central area corresponding to a central portion of the first floating metal and to surround the first metal formed in the first central area, and
the second floating metal is formed in such a manner as to have a vacant space in a second central area corresponding to a central portion of the second floating metal and to surround the second metal formed in the second central area.

(5) The semiconductor device as described in (3) or (4) above,
wherein the first floating metal and the first metal are formed in circular shapes at the bonding surface of the first substrate, and the second floating metal and the second metal are formed in circular shapes at the bonding surface of the second substrate.

(6) The semiconductor device as described in (3) or (4) above, wherein the first floating metal and the first metal are formed in rectangular shapes at the bonding surface of the first substrate, and the second floating metal and the second metal are formed in rectangular shapes at the bonding surface of the second substrate.

(7) The semiconductor device as described in any one of (3) to (6) above, wherein the first floating metal is configured at the bonding surface of the first substrate in such a shape that, in either one of a transverse direction and a longitudinal direction of a rectangle with a vacant space in the first central area, a plurality of slits oriented in another direction are arranged, and the second floating metal is configured at the bonding surface of the second substrate in such a shape that, in the other direction of a rectangle with a vacant space in the second central area, a plurality of slits oriented in the one direction are arranged.

(8) The semiconductor device as described in any one of (3) to (6) above, wherein the first floating metal is configured at the bonding surface of the first substrate in such a shape that a plurality of blocks are each overlapping with at least one adjacent block at corners thereof while having a vacant space in the first central area, and the second floating metal is configured at the bonding surface of the second substrate in such a shape that a plurality of blocks are each overlapping with at least one adjacent block at corners thereof while having a vacant space in the second central area.

(9) The semiconductor device as described in (1) or (2) above, further including:

a floating metal at a bonding surface of a first substrate; and at least two metals connected to an underlying wiring at a bonding surface of a second substrate, wherein the floating metal and the at least two metals are bonded together.

(10) The semiconductor device as described in any one of (1) to (9) above, wherein the semiconductor device is a solid-state imaging device.

(11) An electronic apparatus including:

a solid-state imaging device which includes a floating metal formed at a bonding surface of a substrate, and in which the floating metal is bonded to be utilized as a current path;

a signal processing circuit which processes an output signal outputted from the solid-state imaging device; and an optical system which lets incident light be incident on the solid-state imaging device.

REFERENCE SIGNS LIST

100 Solid-state imaging device, 101, 102 Substrate, 111 Floating metal, 112 Connection pad, 113 Wiring, 121 Floating metal, 122 Connection pad, 123 Wiring, 131 Joint interface, 132 Current path, 200 Solid-state imaging device, 201, 202 Substrate, 211 Floating metal, 221, 222 Connection pad, 223 Underlying wiring, 224 Gate electrode, 225 Underlying wiring, 226 Silicon substrate, 231 Joint interface, 232 Current path, 500 Electronic apparatus, 501 Solid-state imaging device, 502 Optical lens, 503 Shutter device, 504 Driving circuit, 505 Signal processing circuit

What is claimed is:

1. A semiconductor device comprising:
a first substrate; and
a second substrate bonded to the first substrate, wherein the first substrate includes:
a first floating metal formed at a bonding surface between the first substrate and the second substrate;
a first pad formed at the bonding surface and spaced apart from the first floating metal by part of the first substrate; and
a first wiring connected to the first pad,
wherein the second substrate includes:
a second floating metal formed at the bonding surface;
a second pad formed at the bonding surface and spaced apart from the second floating metal by part of the second substrate; and
a second wiring connected to the second pad,
wherein the first pad is bonded to the second floating metal, the first floating metal is bonded to the second floating metal, and the second pad is bonded to the first floating metal,
wherein, in a plan view, the first floating metal overlaps the second floating metal,
wherein, in the plan view, the first pad overlaps the second floating metal, and
wherein, in the plan view, the second pad overlaps the first floating metal.

2. The semiconductor device according to claim 1, wherein, in the plan view, the second floating metal completely overlaps the first pad.

3. The semiconductor device according to claim 2, wherein, in the plan view, the first floating metal completely overlaps the second pad.

4. The semiconductor device according to claim 1, wherein the first floating metal is formed in such a manner as to have a vacant space in a first central area corresponding to a central portion of the first floating metal and to surround the first pad formed in the first central area, and the second floating metal is formed in such a manner as to have a vacant space in a second central area corresponding to a central portion of the second floating metal and to surround the second pad formed in the second central area.

5. The semiconductor device according to claim 4, wherein the first floating metal and the first pad are formed in circular shapes at the bonding surface, and the second floating metal and the second pad are formed in circular shapes at the bonding surface.

6. The semiconductor device according to claim 4, wherein the first floating metal and the first pad are formed in rectangular shapes at the bonding surface of the first substrate, and the second floating metal and the second pad are formed in rectangular shapes at the bonding surface of the second substrate.

7. The semiconductor device according to claim 4, wherein the first floating metal is configured at the bonding surface in such a shape that, in either one of a transverse direction or a longitudinal direction of a rectangle with a vacant space in the first central area, a plurality of slits oriented in another direction are arranged, and the second floating metal is configured at the bonding surface in such a shape that, in the other of the transverse and longitudinal direction of a rectangle with a vacant space in the second central area, a plurality of slits oriented in the one direction are arranged.

8. The semiconductor device according to claim 4, wherein the first floating metal is configured at the bonding surface in such a shape that a plurality of blocks are each overlapping with at least one adjacent block at corners thereof while having a vacant space in the first central area, and the second floating metal is configured at the bonding surface in such a shape that a plurality of blocks are each overlapping with at least one adjacent block at corners thereof while having a vacant space in the second central area.

9. The semiconductor device according to claim 2, wherein the semiconductor device is a solid-state imaging device.

10. An electronic apparatus comprising:
a solid-state imaging device which includes:
a first substrate; and
a second substrate bonded to the first substrate, wherein the first substrate includes:
a first floating metal formed at a bonding surface between the first substrate and the second substrate, wherein the first substrate includes:
a first pad formed at the bonding surface and spaced apart from the first floating metal by part of the first substrate; and
a first wiring connected to the first pad,
wherein the second substrate includes:
a second floating metal formed at the bonding surface;
a second pad formed at the bonding surface and spaced apart from the second floating metal by part of the second substrate; and
a second wiring connected to the second pad,
wherein the first pad is bonded to the second floating metal, the first floating metal is bonded to the second floating metal, and the second pad is bonded to the first floating metal,
wherein, in a plan view, the first floating metal overlaps the second floating metal,
wherein, in the plan view, the first pad overlaps the second floating metal, and
wherein, in the plan view, the second pad overlaps the first floating metal;
a signal processing circuit which processes an output signal outputted from the solid-state imaging device; and
an optical system which directs light to the solid-state imaging device.

* * * * *